(12) United States Patent
Alaoui (10) Patent No.: US 10,119,988 B2
(45) Date of Patent: Nov. 6, 2018

(54) MLU BASED ACCELEROMETER USING A MAGNETIC TUNNEL JUNCTION

(71) Applicant: Crocus Technology SA, Grenoble (FR)

(72) Inventor: Ali Alaoui, Aix-en-Provence (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 15 days.

(21) Appl. No.: 15/324,291

(22) PCT Filed: Jun. 30, 2015

(86) PCT No.: PCT/EP2015/064770
§ 371 (c)(1),
(2) Date: Jan. 6, 2017

(87) PCT Pub. No.: WO2016/005224
PCT Pub. Date: Jan. 14, 2016

(65) Prior Publication Data
US 2017/0160308 A1    Jun. 8, 2017

(30) Foreign Application Priority Data
Jul. 11, 2014  (EP) ..................... 14290201

(51) Int. Cl.
*G01P 15/105* (2006.01)
*G01P 15/08* (2006.01)
(Continued)

(52) U.S. Cl.
CPC ........ *G01P 15/105* (2013.01); *G01P 15/0802* (2013.01); *G01P 15/0885* (2013.01);
(Continued)

(58) Field of Classification Search
None
See application file for complete search history.

(56) References Cited

U.S. PATENT DOCUMENTS

2007/0025027 A1*  2/2007  Chung ................. G01R 33/06
                                                      360/324.2
2007/0099031 A1   3/2007  Chung et al.
(Continued)

FOREIGN PATENT DOCUMENTS

EP    1363134 A2    11/2003

OTHER PUBLICATIONS

International Search Report for PCT/EP2015/064770 dated Sep. 21, 2015.
Written Opinion for PCT/EP2015/064770 dated Sep. 21, 2015.

*Primary Examiner* — Paul West
*Assistant Examiner* — Mark A Shabman
(74) *Attorney, Agent, or Firm* — Pearne & Gordon LLP (57) ABSTRACT

An MLU-based accelerometer including: at least one MLU including a tunnel barrier layer between a first magnetic layer having a fixed first magnetization direction and a second magnetic layer having a second magnetization direction that can be varied. A proof-mass includes a ferromagnetic material having a proof-mass magnetization inducing a proof-mass field, the proof-mass being elastically suspended such as to be deflected in at least one direction when subjected to an acceleration vector. The proof-mass is magnetically coupled to the MLU cell via the proof-mass field. A read module is configured for determining a magnetoresistance of each MLU cell such as to determine an acceleration vector from the deflection of the proof-mass relative to any one of the at least one MLU cell.

7 Claims, 5 Drawing Sheets

(51) Int. Cl.
*G01P 15/18* (2013.01)
*G01R 33/09* (2006.01)
*G01D 5/14* (2006.01)

(52) U.S. Cl.
CPC ............ G01P 15/18 (2013.01); G01R 33/098 (2013.01); *G01D 5/145* (2013.01)

(56) References Cited

U.S. PATENT DOCUMENTS

2013/0066587 A1 3/2013 Kalathil et al.
2013/0255381 A1* 10/2013 Ricotti .................. G01P 15/105
73/514.31

* cited by examiner

MLU BASED ACCELEROMETER USING A MAGNETIC TUNNEL JUNCTION

FIELD

The present invention concerns an accelerometer device that has an increased sensitivity.

DESCRIPTION OF RELATED ART

An accelerometer is a MEMS device that is used to measure acceleration forces. The traditional applications include vibration measurement, earthquake detection and seismic applications. One of the most common uses for MEMS accelerometers is in airbag deployment systems for automobiles and in potentially all smartphone and tablets. The widespread use of accelerometers in the automotive and mobile industry has dramatically reduced their cost. In the present market, single-axis, dual-axis, and three-axis models are commonly available. The performance of capacitive accelerometers has been dramatically improved since the first microaccelerometer was introduced.

Figure 1A:
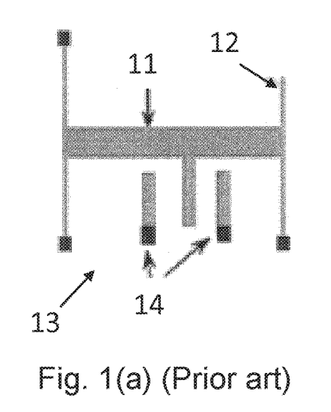
FIG. 1(a) and FIG. 1(b) show a conventional capacitive proof-mass suspended accelerometer.
Figure 1B:
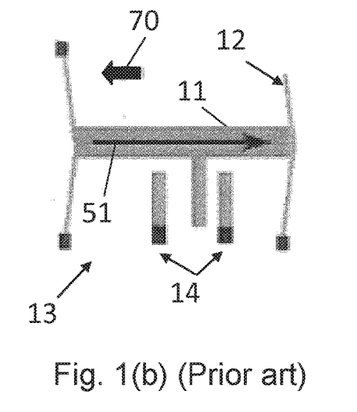

Displacement accelerometers measure the displacement of a suspended proof-mass in response to an input acceleration. FIG. 1 (a) shows a schematic of a capacitive-based accelerometer 1 comprising a proof-mass 11 suspended by elastic tethers 12 and comb-shaped electrodes 13 comprising two fixed plates 14. FIG. 1 (b) also shows the proof-mass 11 of the capacitive-based accelerometer being deflected 51 toward the right due to an acceleration 70 directed toward the left.

Figure 2:
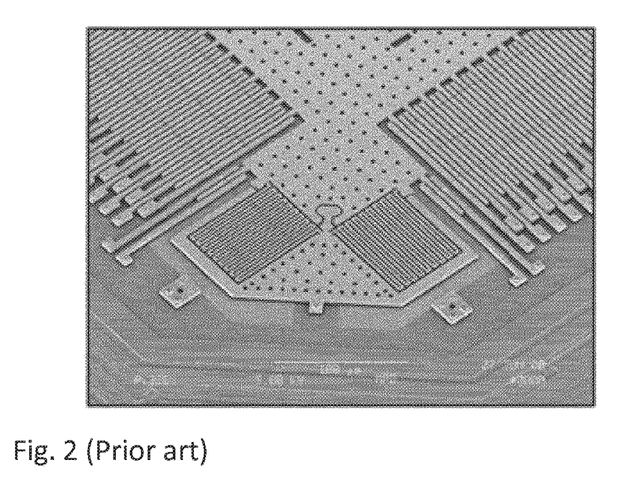
FIG. 2 is a SEM image showing the comb architecture of a conventional capacitive accelerometer.

FIG. 2 is a SEM image showing the comb architecture of a capacitive accelerometer.

The information encoded by capacitive accelerometers is the value of the capacitance. In other words, inducing an acceleration on the capacitive accelerometer translates in a change in value of the micro-capacitances.

Figure 3:
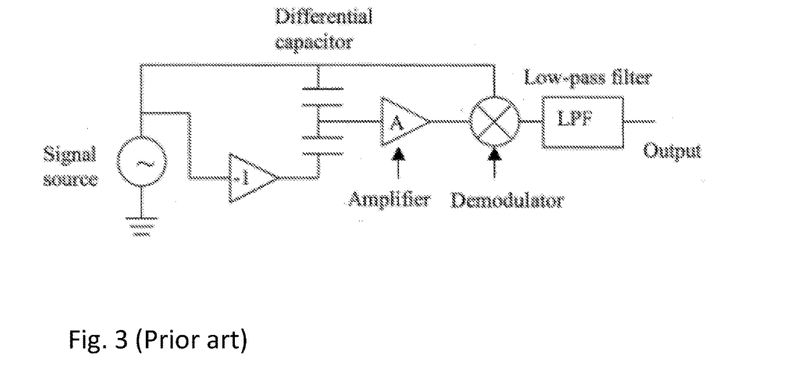
FIG. 3 shows a conventional open-loop system.

Most recent accelerometers use an open-loop system as shown in FIG. 3. The signals applied to the two fixed plates 14 of the accelerometer 1 are AC signals 180° out of phase. The output of the measuring circuit is AC signal whose amplitude is proportional to the capacitance of interest. To extract this amplitude in a way that can follow the variations associated with the changing of capacitance C, one can use a synchronous demodulator. The carrier signals are filtered by the low-pass filter to remove unrelated information.

The variations of the capacitances are typically in the femto-farad range.

MEMS are the integration of mechanical elements shrunk to micro-meter dimensions with electronics on a common silicon substrate. At this scale ($\mu$m), it is critical to have a good understanding of the scaling properties of the mechanisms, the design, the material and fabrication processes. Research from K. S. J. Pister from UC Berkeley and other researchers: MEMS performance is inversely related to size. The raw sensitivity of most sensors decrease as their dimensions get smaller.

The fundamental limit of most MEMS sensor system is thermal noise. Temperature, the vibration of molecules, causes all mechanical and electrical devices to jitter around with an average kinetic energy of around $10^{-21}$ Joules. This is enough to disturb the measurements of the capacitive accelerometers that usually are of a scale of femto-farads ($10^{-12}$ Farads).

Capacitive accelerometers can detect single 1-g variations which are enough for automotive airbags applications or smartphone orientation detection. However, capacitive accelerometers struggle at micro-g variations that are critical in applications in healthcare or real-time applications.

US2007025027 discloses a method and apparatus for sensing physical parameters. The apparatus comprises a magnetic tunnel junction (MTJ) and a magnetic field source whose magnetic field overlaps the MTJ and whose proximity to the MTJ varies in response to an input to the sensor. The MTJ comprises first and second magnetic electrodes separated by a dielectric configured to permit significant tunneling conduction therebetween. The first magnetic electrode has its spin axis pinned and the second magnetic electrode has its spin axis free. The magnetic field source is oriented closer to the second magnetic electrode than the first magnetic electrode. The overall sensor dynamic range is extended by providing multiple electrically coupled sensors receiving the same input but with different individual response curves and desirably but not essentially formed on the same substrate.

US2013066587 discloses a position sensor which comprises an integrated circuit, and a magnetic field sensor that provides a detected signal indicative of a position of a magnetic field source to the integrated circuit. The magnetic field sensor comprises a tunneling magnetoresistance (TMR) sensor. The position sensor further comprises a wireless circuit coupled to the integrated circuit, wherein the wireless circuit comprises an antenna configured to radiate a position signal based on the detected signal.

US2013255381 discloses an inertial sensor having a body with an excitation coil and a first sensing coil extending along a first axis. A suspended mass includes a magnetic-field concentrator, in a position corresponding to the excitation coil, and configured for displacing by inertia in a plane along the first axis. A supply and sensing circuit is electrically coupled to the excitation coil and to the first sensing coil, and is configured for generating a time-variable flow of electric current that flows in the excitation coil so as to generate a magnetic field that interacts with the magnetic-field concentrator to induce a voltage/current in the sensing coil. The integrated circuit is configured for measuring a value of the voltage/current induced in the first sensing coil so as to detect a quantity associated to the displacement of the suspended mass along the first axis.

Prior solutions all fall under two categories: better design approaches, better amplifiers.

The different design approaches intended to help stabilize the already very small capacitive measurements (in femto-farads) usually induce higher costs during fabrication process. Also the CMOS circuitry have to compensate for the temperature variations (generated by the motion of the chip) and there is an increasing need for more accurate amplifiers.

SUMMARY

The present disclosure concerns an MLU-based accelerometer comprising:

at least one MLU cell comprising a tunnel barrier layer between a first magnetic layer having a fixed first magnetization direction and a second magnetic layer having a second magnetization direction that can be varied and that is oriented anti-parallel to the first magnetization due to magnetic coupling between the second and first layers;

a proof-mass comprising a ferromagnetic material having a proof-mass magnetization inducing a proof-mass field, the proof-mass being elastically suspended such as to be able of being deflected in at least one direction when subjected to an acceleration vector, the proof-mass being magnetically coupled to said at least one MLU cell via the proof-mass field; and a read module configured for determining a magnetoresistance of each of said at least one MLU cell such as to determine an acceleration vector from the deflection of the proof-mass relative to any one of said at least one MLU cell.

The MLU-based accelerometer disclosed herein is intended to replace the capacitive based MEMS accelerometers and should offer greater sensibility without the need for amplifiers. The MLU-based accelerometer also has lower static power consumption and offers advantages during process fabrication. Indeed, the MLU-based accelerometer can do without the comb-structures, complicated to process but necessary to the normal functioning of the capacitance based accelerometers. Moreover, the MLU-based accelerometer does not require sensing circuitry typically needed for the capacitance based accelerometers.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

The principle of the invention is to replace the capacitances in the MEMS accelerometers by MLU stacks that can be considered as variable resistors. The accelerometer will still be based on a proof-mass system. However, the comb-architecture that capacitive accelerometers require will not be necessary.

Figure 4:
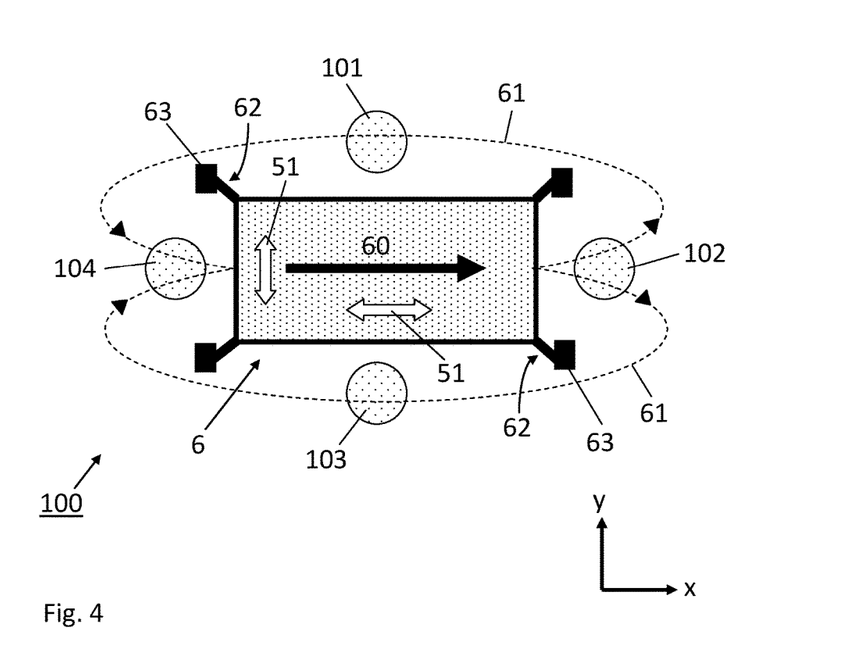
FIG. 4 shows a top view of a two-dimensional MLU-based accelerometer comprising a proof-mass inducing a proof-mass field and a plurality of MLU cells, according to an embodiment.

A top view of a two-dimensional MLU-based accelerometer 100 is pictured in FIG. 4, according to an embodiment. The MLU-based accelerometer 100 comprises a proof-mass 6 comprising a ferromagnetic material having a proof-mass magnetization 60 oriented in a predetermined direction inducing a proof-mass filed 61. The proof-mass 6 is suspended by a spring element 62 such that, when the accelerometer 100 is subjected to an acceleration vector, the proof-mass 6 is deflected in a direction opposed to the direction of the acceleration vector. In the example of FIG. 4, the two-dimensional MLU-based accelerometer 100 comprises four flexible beams 62 acting as spring element and located at each of the four corners of the proof-mass 6. The symmetric arrangement of the four flexible beams 6 with respect to the mass-proof centerline allows the proof-mass 6 to be deflected in an x direction and/or an y direction, depending on the direction of the acceleration vector, and a low cross-axis sensitivity. The flexible beams 62 can be attached to a fix structure via anchor elements 63.

Other arrangements of the spring element are contemplated. For example, the four flexible beams 6 can be arranged on the side of the proof-mass 6.

The MLU-based accelerometer 100 further comprises four MRAM-based MLU cells. A first MLU cell 101 and a third MLU cell 103 are disposed on each side of the proof-mass 6 in they direction. A second MLU cell 102 and a fourth MLU cell 104 are disposed on each side of the proof-mass 6 in the x direction. The first and fourth MLU cells 101, 104 can be used for detecting acceleration along the x-direction and the second and third MLU cells 102, 103 can be used for detecting acceleration along the y-direction.

Figure 5:
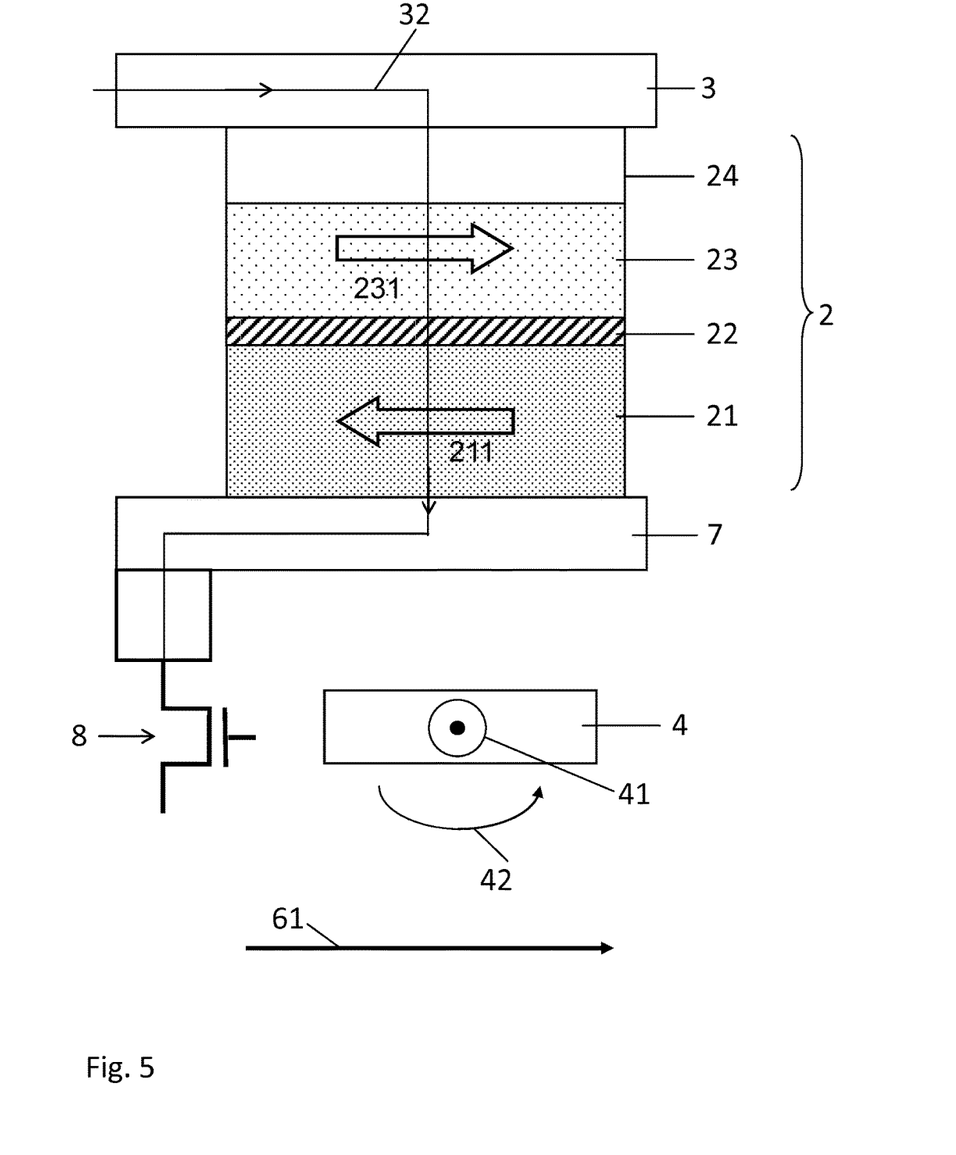
FIG. 5 illustrates a side view of a MLU cell comprising a storage layer and a sense layer, according to an embodiment

FIG. 5 illustrates a side view of one of the four MLU cells 101, 102, 103, 104, according to an embodiment. The MLU cell 101-104 comprises a magnetic tunnel junction 2 including a first magnetic layer 23, a second magnetic layer 21, and a tunnel barrier layer 22 that is disposed between the first magnetic layer 23 and the second magnetic layer 21. Also shown in FIG. 5 is a transistor 8 connected to the magnetic tunnel junction 2 via a strap 7. The first magnetic layer can be a storage layer 23 having a storage magnetization 231 and the second magnetic layer can be a sense layer 21 having a sense magnetization 211. Each of the sense layer 21 and the storage layer 23 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 21 and the storage layer 23 can include the same ferromagnetic material or different ferromagnetic materials. As illustrated in FIG. 5, the sense layer 21 can include a soft ferromagnetic material, namely one having a relatively low coercivity, while the storage layer 23 can include a hard ferromagnetic material, namely one having a relatively high coercivity. In such manner, the sense magnetization 211 can be readily varied under low-intensity magnetic fields. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni80Fe20); alloys based on Ni, Fe, and boron ("B"); Co90Fe10; and alloys based on Co, Fe, and B. In some instances, alloys based on Ni and Fe (and optionally B) can have a smaller coercivity than alloys based on Co and Fe (and optionally B). A thickness of each of the sense layer 21 and the storage layer 23 can be in the nm range, such as from about 1 nm to about 20 nm or from about 1 nm to about 10 nm. Other implementations of the sense layer 21 and the storage layer 23 are contemplated. For example, either, or both, of the sense layer 21 and the storage layer 23 can include multiple sub-layers in a fashion similar to that of the so-called synthetic antiferromagnetic layer.

The tunnel barrier layer 22 can include, or be formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 1 nm to about 10 nm.

Other implementations of the MLU cells 101-104 are contemplated. For example, the relative positioning of the sense layer 22 and the storage layer 23 can be reversed, with the sense layer 21 disposed above the storage layer 23.

Referring to FIG. 5, the magnetic tunnel junction 2 also includes a storage antiferromagnetic layer 24, which is disposed adjacent to the storage layer 23 and, through exchange bias, pins the storage magnetization 231 along a particular direction when a temperature within, or in the vicinity of, the storage antiferromagnetic layer 24 is at a low threshold temperature $T_L$, i.e., below a blocking temperature, such as a Neel temperature, or another threshold temperature of the storage antiferromagnetic layer 24. The storage antiferromagnetic layer 24 unpins, or frees, the storage magnetization 231 when the temperature is at a high threshold temperature $T_H$, i.e., above the blocking temperature, thereby allowing the storage magnetization 231 to be switched to another direction. The storage antiferromagnetic layer 24 includes, or is formed of, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). For example, the storage antiferromagnetic layer 24 can include, or be formed of, an alloy based on Ir and Mn (or based on Fe and Mn) having a high threshold temperature $T_H$ in the range of about 120° C. to about 220° C., or about 150° C. to about 200° C. Because the sense magnetization 211 is unpinned, the high threshold temperatures $T_H$ can be selected to accommodate a desired application, such as a high temperature application, in the absence of, or without regard to, a threshold temperature that would otherwise set an upper bound of an operating temperature window. The sense magnetization 211 is freely adjustable at the low and high threshold temperatures $T_L$, $T_H$. This type of MLU cell 1 comprising the sense layer 21 with the freely adjustable sense magnetization 211 is known as self-referenced MLU cell.

The storage magnetization 231 has a predetermined direction that can be set by using a thermally assisted switching (TAS) writing operation comprising the steps of heating the magnetic tunnel junction 2 at the high threshold temperatures $T_H$ and switching the storage magnetization 231 in the predetermined direction.

Alternatively, the MLU cell 101-104 can be implemented with the sense magnetization 211 and a reference magnetization 231 which is typically a magnetization that may be pre-configured, such as in the factory, but subsequently may have a fixed direction. The storage layer 23 of the MLU cell 101-104 can be set by heating the magnetic tunnel junction 2, followed by applying a current (not shown) in the field line 4 to align the reference magnetization 231 in the appropriate direction. This setting may occur as pre-configuration in the factory and/or as configuration after the MLU-based accelerometer 100 leaves the factory.

Figure 6:
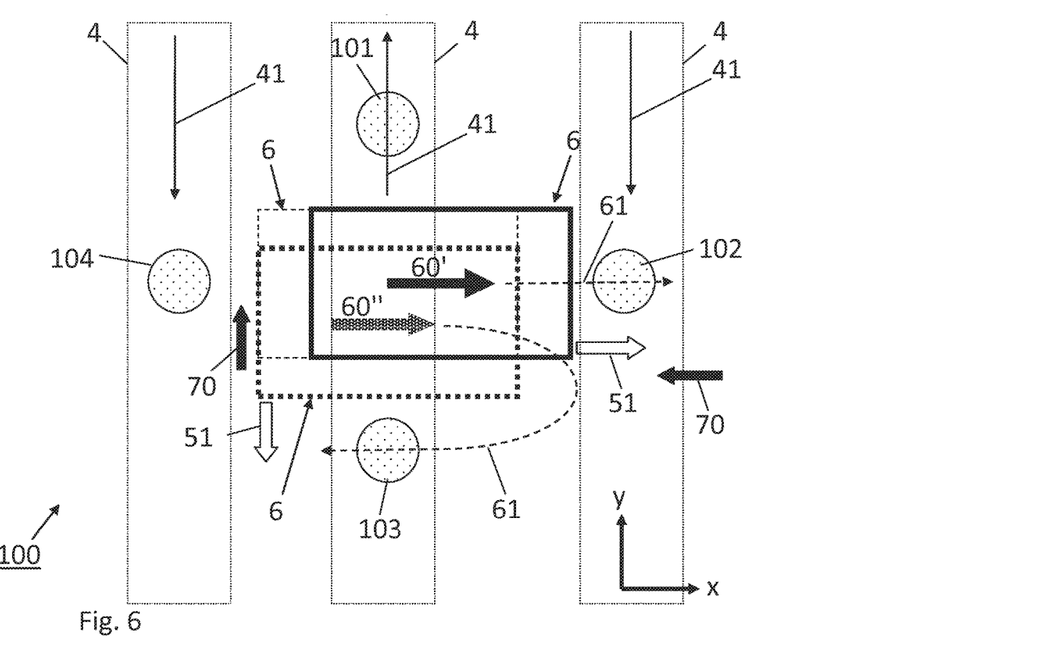
FIG. 6 illustrates a top view of the MLU-based accelerometer showing a proof-mass deflected by an acceleration vector.

FIG. 6 illustrates a top view of the MLU-based accelerometer 100 showing the proof-mass 6 being deflected upon being subjected to an acceleration vector 70. In particular, FIG. 6 represents the proof-mass 6 in an initial position in the absence of acceleration (shown by the light dashed line). The proof-mass 6 is also represented (by the plain line) deflected by a first deflection 51 in an x direction toward the second MLU cell 102, when subjected to an acceleration vector 70 directed toward the left. The proof-mass 6 deflected in the x direction has a proof-mass magnetization 60'. In this configuration, the proof-mass 6 becomes closer to the second MLU cell 102 and the second MLU cell 102 sees an increased magnitude of the proof-mass field 61 directed toward the right. The proof-mass 6 is also represented (by the bold dashed line) deflected by a deflection 51 in a y direction toward the third MLU cell 103, when subjected to an acceleration vector 70 directed upwards. The proof-mass 6 deflected in the y direction has a proof-mass magnetization 60".

Figure 7:
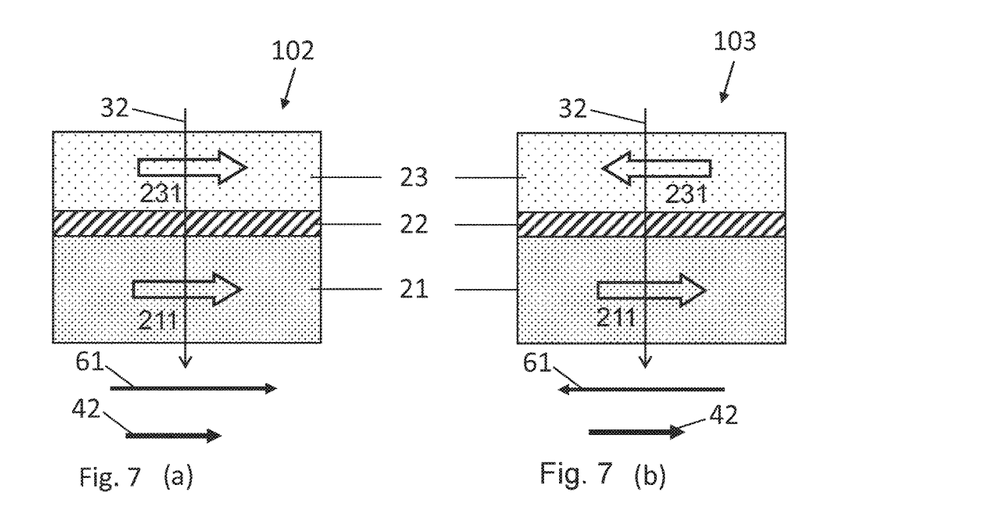
FIGS. 7a and 7b illustrate a storage magnetization of the storage layer and a sense magnetization of the sense layer in the presence of the proof-mass field, according to an embodiment.

FIG. 7(*a*) and FIG. 7(*b*) illustrate the storage magnetization direction 231 and the sense magnetization direction 211 of the MLU cells 101-104 in the presence of the proof-mass field 61, according to an embodiment. FIG. 7*a* illustrates the particular configuration of the accelerometer 100 where the storage magnetization 231 of the second MLU cell 102 and the fourth MLU cell 104 has a predetermined direction aligned substantially parallel to the proof-mass field 61 (thus a direction of the storage magnetization 231 oriented toward the right in FIGS. 6 and 7*a*). FIG. 7*b* illustrates the particular configuration of the accelerometer 100 where the storage magnetization 231 of the first MLU cell 101 and the third MLU cell 103 has also a predetermined direction aligned substantially parallel to the proof-mass field 61 (thus a direction of the storage magnetization 231 oriented toward the left in FIGS. 6 and 7*b*).

In the particular configuration of FIGS. 6 and 7(*a*) and (*b*), the proof-mass field 61 is oriented substantially parallel with the storage magnetization direction 231. A magnetic dipolar coupling occurs between the storage magnetization 231 and the sense magnetization 211 such that the sense magnetization 211 is aligned substantially anti-parallel to the storage magnetization 231 in the absence of an external magnetic field. A deflection of the proof-mass 6 in the positive or negative x direction and y direction will result in a decrease in the effective sense magnetization 211 and in an decrease in the substantially anti-parallel coupling magnetization of the sense layer 21, in the MLU cell 101-104 toward which the proof-mass 6 is deflected.

In reference to FIGS. 5 and 6, the MLU cell 101-104 further includes a field line 4 that is magnetically coupled to the magnetic tunnel junction 2 and a bit line 3 that is electrically coupled to the magnetic tunnel junction 2. The field line 4 is adapted for passing a bias field current 41 such as to induce a bias magnetic field 42 and the bit line 3 is adapted for passing a sense current 32. In FIG. 6, three field lines 4, or three field line portions 4, are arranged parallel with each other such that each of the second and fourth MLU cells 102, 104 are addressed by an independent field line 4, and the first and third MLU cells 101, 103 are addressed independently from second and fourth MLU cells 102, 104 by another field line 4.

During a read operation of the MLU-based accelerometer 100, a magnetoresistance of each of the MLU cells 101-104 can be modulated by passing a bias field current 41 with a modulated polarity in the bias field line 4 which is set by an input bit to be matched. During a read operation of the MLU-based accelerometer 100, the storage magnetization direction 231 remains stable in its predetermined direction. In particular, a modulated bias field current 41 can be passed in the field line 4 such as induce a bias magnetic field 42 configured for switching the sense magnetization 211 from an orientation substantially anti-parallel to the storage magnetization 231 to an intermediary state (between parallel and antiparallel) where the junction is highly sensitive to the external magnetic field emitted by the proof-mass 6. The intermediary state of the sense magnetization 211 can correspond to an orientation of the sense magnetization 211 being substantially perpendicular to the storage magnetization 231. In any case, the intermediary state of the sense magnetization 211 results in a variation in the resistance R of the magnetic tunnel junction 2 of the MLU cell 101-104, due to the variation in orientation of the sense magnetization 211 with the proof-mass field 61, that is substantially linear with the variation of the proof-mass field 61.

Figure 8:
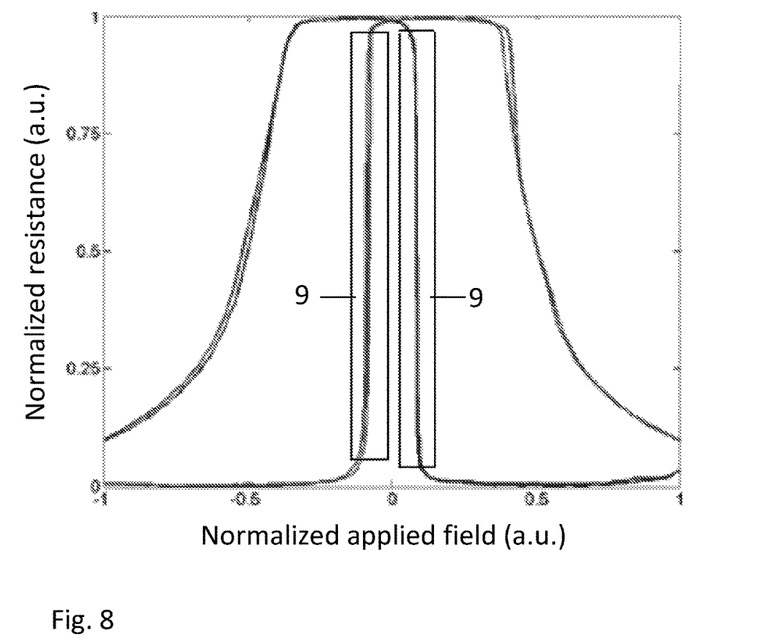
FIG. 8. shows a variation in a resistance of the MLU cell when a bias magnetic field is applied.

FIG. 8 shows a variation in a resistance of the MLU cell 101-104 (normalized resistance) when the bias magnetic field 42 (normalized applied field) is applied in the field line 4. The same type of variation in a resistance as a function of the bias magnetic field 42 can be obtained for passing the field current 41 in the current line 4 addressing a plurality of MLU cells 101-104 in series. In other words, the bias magnetic field 42 sets the sense magnetization 211 relative to the storage magnetization 231 such that the sense magnetization 211 varies in a substantially linear fashion with a variation in the proof-mass field 61. In FIG. 8, the linear portion of the resistance current curve is shown within the rectangle 9.

In this highly sensitive state, i.e., in the linear portion of the resistance—current curve, a small change in the external magnetization (a small variation in the proof-mass field 61 due to the deflection of the proof-mass 6) leads to a large linear change in the resistance value of the junction 2. In the example of FIGS. 6 and 7(*a*) and (*b*), this is achieved by passing a bias field current 41 in the field line 4 addressing the first and third MLU cells 101, 103 having a polarity opposed to the one addressing the second and fourth MLU cells 102, 104. The bias magnetic field 42.

The magnitude of the bias field current 41 required for switching the sense magnetization 211 to a highly sensitive magnetic state of the MLU cell 101-104 toward which the proof-mass 6 is deflected is increased in proportion to the magnitude of the proof-mass field 61, and thus, in proportion to the magnitude of deflection of the proof-mass 6.

A degree of alignment between the sense magnetization direction 211 and the storage magnetization direction 231 can be determined by applying a sense current 32 in the magnetic tunnel junction 2, for example, via the bit line 3 (see FIG. 5). Measuring a voltage across the magnetic tunnel junction 2 when the sense current 32 is applied yields a resistance value R of the magnetic tunnel junction 2 for a particular alignment of the sense magnetization 211 relative to the orientation of the storage magnetization 231. Alternatively, a resistance value can be determined by applying a voltage across the magnetic tunnel junction 2 and measuring a current. When the sense magnetization 211 is anti-parallel to the storage magnetization 231, a resistance value R of the magnetic tunnel junction 2 typically corresponds to a maximum value, namely Rmax, and, when the respective magnetizations are parallel, a resistance value of the magnetic tunnel junction 2 typically corresponds to a minimum value, namely Rmin.

In one example, assuming that the proof-mass field 61 in the direction of the storage magnetization 231 is g % of the coupling component of the sense magnetization 211, a resistance of the MLU cell 101-104 can change (relative to Rmin) by about (g*(Rmax−Rmin)/Rmin) percent.

An acceleration in a x or y direction can thus be measured via the change in resistance of the magnetic tunnel junction 2 of any on the MLU cells 101-104 included in the MLU-based accelerometer 100.

Other arrangements of the MLU-based accelerometer 100 are contemplated. For example, the a row comprising a plurality of MLU cells can be disposed on each side of the proof-mass 6, such as to amplify the resistance signal corresponding to the acceleration measurement in any one the x and y directions. For example, a MLU-based accelerometer can be provided by coupling an array comprising several (possibly tens of thousands) of MLU cells together, wherein the array is located on each side of the proof-mass 6. Such configuration allows for increasing the output signal and the measuring current gain while coupling capacitance remains very small.

A three-dimensional MLU-based accelerometer can be obtained by disposing one or a plurality of MLU cells on top and below the proof-mass 6 and the proof mass can be arranged for deflecting in a z direction, such as to sense an acceleration vector directed in the z direction.

What is claimed is:

1. An MLU-based accelerometer comprising:
at least one MLU cell comprising a tunnel barrier layer between a first magnetic layer having a fixed first magnetization direction and a second magnetic layer having a second magnetization direction that can be varied;
a proof-mass comprising a ferromagnetic material having a proof-mass magnetization inducing a proof-mass field, the proof-mass being elastically suspended such as to be able of being deflected in at least one direction when subjected to an acceleration vector, the proof-mass being magnetically coupled to said at least one MLU cell via the proof-mass field;
a read module configured for, during a read operation, determining a magnetoresistance of each of said at least one MLU cell such as to determine an acceleration vector from the deflection of the proof-mass relative to any one of said at least one MLU cell,
said read module comprising means for, during the read operation, switching the second magnetization in an intermediary state between parallel and antiparallel to the first magnetization such that the second magnetization varies in a substantially linear fashion with a variation in the proof-mass field; and means for determining a degree of alignment between the sense magnetization direction and the storage magnetization direction.

2. The accelerometer according to claim 1, wherein said means comprises a field line magnetically coupled to the MLU cell, the field line being configured for passing a bias field current inducing a bias field.

3. The accelerometer according to claim 2, wherein said bias field current has a modulated polarity.

4. The accelerometer according to claim 1, wherein said read module further comprises a bit line configured for passing a sense current in the MLU cell via the bit line.

5. The accelerometer according to claim 1, wherein the proof-mass extends in an x-y plane, the accelerometer further comprising a plurality of MLU cells on each side of the proof-mass in the x direction and a plurality of MLU cells on each side of the proof-mass in the y direction.

6. The accelerometer according to claim 1, wherein the proof-mass extends in a x-y plane, the accelerometer further comprising one or a plurality of MLU cells on top and below the proof-mass, in a z direction perpendicular to the x-y plane, such that an acceleration vector directed in the z direction can be sensed.

7. The accelerometer according to claim 1, wherein said intermediary state corresponds to an orientation of the first magnetization that is substantially perpendicular to the orientation of the second magnetization.

* * * * *